(12) United States Patent
Wert

(10) Patent No.: US 7,362,126 B1
(45) Date of Patent: Apr. 22, 2008

(54) FLOATING CMOS INPUT CIRCUIT THAT DOES NOT DRAW DC CURRENT

(75) Inventor: Joseph Douglas Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 179 days.

(21) Appl. No.: 11/205,967

(22) Filed: Aug. 17, 2005

(51) Int. Cl.
*H03K 17/16* (2006.01)

(52) U.S. Cl. .............................. 326/23; 326/27; 326/83

(58) Field of Classification Search ............ 326/21–27, 326/82–87
See application file for complete search history.

(56) References Cited

U.S. PATENT DOCUMENTS

| | | | |
|---|---|---|---|
| 5,324,996 A | 6/1994 | Mote, Jr. | |
| 5,329,174 A * | 7/1994 | Chiang | 327/313 |
| 6,055,191 A * | 4/2000 | Sher et al. | 365/189.05 |
| 6,225,838 B1 * | 5/2001 | Lee | 327/108 |
| 6,265,931 B1 * | 7/2001 | Lutley et al. | 327/530 |
| 6,859,084 B2 * | 2/2005 | Stansfield et al. | 327/325 |

OTHER PUBLICATIONS

"Implications of Slow or Floating CMOS Inputs", Texas Instruments, Feb. 1998, 16 pages.
"The Behaviour of Integrated Bus Hold Circuits" IC24 Data Handbook, Philips Semiconductors, Mar. 1996, 6 pages.

* cited by examiner

*Primary Examiner*—Don Le

(57) ABSTRACT

A floating CMOS input circuit is disclosed that does not draw direct current. The floating CMOS input circuit comprises a first inverter circuit that is capable of being coupled to an input voltage (Vin) and an n-channel pull-down transistor (N1) that is coupled to the first inverter circuit. The n-channel pull-down transistor (N1) pulls the input voltage (Vin) on the first inverter circuit to a hard ground when the input voltage (Vin) is not driven high. This eliminates the leakage of direct current in the first inverter circuit. The floating CMOS input circuit also powers up in a known state.

19 Claims, 3 Drawing Sheets

US 7,362,126 B1

FLOATING CMOS INPUT CIRCUIT THAT DOES NOT DRAW DC CURRENT

TECHNICAL FIELD OF THE INVENTION

The present invention is generally directed to manufacturing technology for semiconductor devices and, in particular, to efficient circuitry for providing a floating CMOS input circuit that does not draw DC current.

BACKGROUND OF THE INVENTION

A common problem encountered by digital inputs on semiconductor integrated circuit chips involves the state of the digital inputs when the chip is powered up. If the digital inputs are floated the tendency of the digital inputs is to have a voltage value that is near some mid-rail value of voltage. This causes the input circuit to draw a significant level of current.

For example, FIG. 1 illustrates a graph of current versus time that shows the amount of current that flows in a typical Complementary Metal Oxide Semiconductor (CMOS) input circuit if the input is floated. As shown in FIG. 1, the value of the current rises in a short time from a value of zero to approximately three hundred micro-Amperes (300 µA). An integrated circuit chip that has many digital inputs can easily be leaking three hundred micro-Amperes (300 µA) for each digital input. In an environment in which low power consumption is required this amount of leakage is unacceptable.

A typical prior art method for handling this problem is to place a pull-down resistor on the input. FIG. 2 illustrates a prior art floating CMOS input circuit 200 in which the digital input is allowed to float. The leakage current versus time that is shown in the graph of FIG. 1 is the current flowing through the drain of the n-channel transistor N2 shown in FIG. 2. That is why the leakage current is identified as ID(N2) for N2 drain current.

A typical prior art pull-down resistor R1 is illustrated in FIG. 3. The circuit that is shown in FIG. 3 is the same circuit that is shown in FIG. 2 except that the pull-down resistor R1 has been placed on the input in parallel with n-channel transistor N2.

The presence of pull-down resistor R1 ensures that if the input voltage (Vin) is not driven, then the pull-down resistor R1 will pull the input voltage to a hard ground. This will prevent current leakage between p-channel transistor P2 and n-channel transistor N1.

There are two drawbacks to this prior art approach. The first drawback is that a pull-down resistor would have to be provided to every input circuit that would potentially be a floating CMOS input circuit. This would very likely be impractical for many circuits. The second drawback is that if the input voltage (Vin) experiences a high value of voltage (e.g., 3.3 volts), then the input would draw approximately one hundred sixty micro-Amperes (160 µA) from whatever source is driving the input voltage (Vin). This level of current consumption is to be avoided in a low power circuit design.

The prior art approach discussed above is inefficient because it requires a pull-down resistor for every floating input and because it generates too much current consumption for a low power consumption circuit. Therefore, it would be advantageous to have a more efficient system and method for providing a floating CMOS input circuit in a semiconductor integrated circuit chip.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 4 through 7, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged floating CMOS input circuit.

Figure 2:
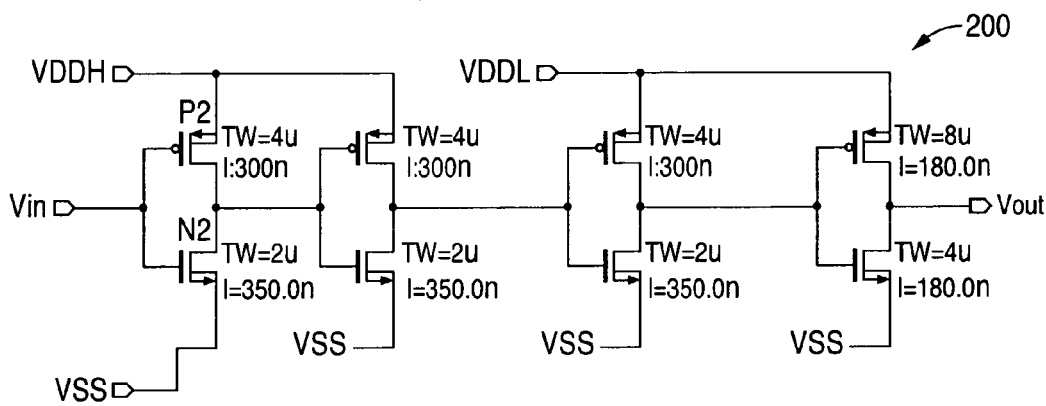
FIG. 2 illustrates an exemplary prior art floating CMOS input circuit.
Figure 3:
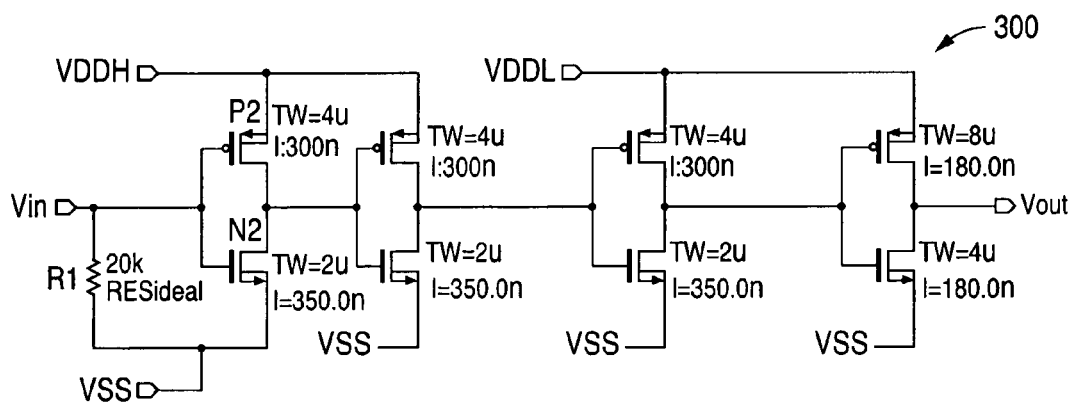
FIG. 3 illustrates the exemplary prior art floating CMOS input circuit illustrated in FIG. 2 with an exemplary prior art pull-down resistor.
Figure 4:
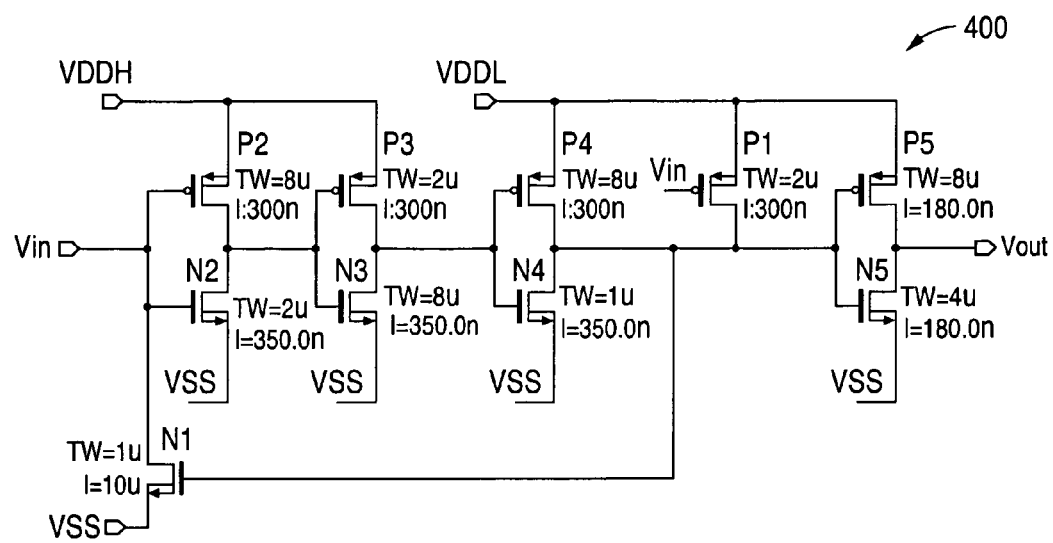
FIG. 4 illustrates a floating CMOS input circuit constructed in accordance with the principles of the present invention.

FIG. 4 illustrates an advantageous embodiment of a floating CMOS input circuit 400 constructed in accordance with the principles of the present invention. The floating CMOS input circuit 400 is similar in structure to the floating CMOS input circuit 200 shown in FIG. 2 except that an n-channel pull-down transistor N1 and a p-channel bias transistor F1 have been added and the relative sizes of the other transistors have been altered. As will be more fully described, the floating CMOS input circuit 400 eliminates current leakage on the input inverter (buffer) (1) without having a direct current draw on the input voltage source that is driving the input voltage (Vin), and (2) without adding an extra external devices to the integrated circuit chip.

The first inverter circuit comprises the first inverter p-channel transistor P2 and the first inverter n-channel transistor N2. A second inverter circuit is coupled to the output of the first inverter circuit. The second inverter circuit comprises the second inverter p-channel transistor P3 and the second inverter n-channel transistor N3. A third inverter circuit is coupled to the output of the second inverter circuit. The third inverter circuit comprises the third inverter p-channel transistor P4 and the third inverter n-channel transistor N4. A fourth inverter circuit is coupled to the output of the third inverter circuit. The fourth inverter circuit comprises the fourth inverter p-channel transistor P5 and the fourth inverter n-channel transistor N5.

The drain of the n-channel pull-down transistor N1 is coupled to the input voltage (Vin) and to the gate of the first inverter p-channel transistor P2 and to the gate of the first inverter n-channel transistor N2. The source of the n-channel pull-down transistor N1 is coupled to the ground voltage VSS. The gate of the n-channel pull-down transistor N1 is coupled to the drain of third inverter p-channel transistor P4 and to the drain of third inverter n-channel transistor N4.

The drain of p-channel bias transistor P1 is coupled to the gate of the n-channel pull-down transistor N1 and to the drain of third inverter p-channel transistor P4 and to the drain of third inverter n-channel transistor N4. The gate of the p-channel bias transistor P1 is coupled to the input voltage (Vin). The source of the p-channel bias transistor P1 is coupled to the power voltage VDDL.

The standard ratio for achieving an equal strength between a p-channel transistor P and an n-channel transistor N is approximately two to one (2:1). That is, a p-channel transistor P should be approximately twice the size of an n-channel transistor N in order to have an equal drive strength. For example, assuming that the lengths (L) are equal in both transistors, the width (W) of the p-channel transistor P should be twice the width (W) of the n-channel transistor N. In the following discussion the lengths (L) of the various transistors are assumed to be equal.

In the floating CMOS input circuit 400 of the present invention, the width (W) of the first inverter p-channel transistor P2 is constructed to be approximately four (4) times the width of the first inverter n-channel transistor N2. The width (W) of the second inverter n-channel transistor N3 is constructed to be approximately four (4) times the width of the second inverter p-channel transistor P3. Then the width (W) of the third inverter p-channel transistor P4 is constructed to be approximately eight (8) times the width of the third inverter n-channel transistor N4.

The choice for the sizes of the transistors give a definite preference to the input voltage (Vin) being seen as a "low" at the time of power-up unless the input voltage (Vin) is driven "high". This preference places a "high" signal on the gate of n-channel pull-down transistor N1 and will pull the input voltage (Vin) to hard ground. This will ensure that there will be no current leakage between first inverter p-channel transistor P2 and first inverter n-channel transistor N2.

N-channel pull-down transistor N1 is sized to be resistive so that a very weak external driver can still drive the input voltage (Vin) "high." If the input voltage (Vin) is driven "high", then the gate of n-channel pull-down transistor N1 will be driven to ground and there will be no direct current (DC) load on the driver to the input voltage (Vin).

P-channel bias transistor P1 may optionally be added for an additional guard against the input voltage (Vin) not floating sufficiently low to begin the process of events. If the p-channel bias transistor P1 is used, the strength of the p-channel bias transistor P1 must be relatively weak. Specifically, the strength of the p-channel bias transistor P1 should be kept at a strength level that is twenty five percent (25%) or less than the strength level of third inverter p-channel transistor P4.

Figure 5:
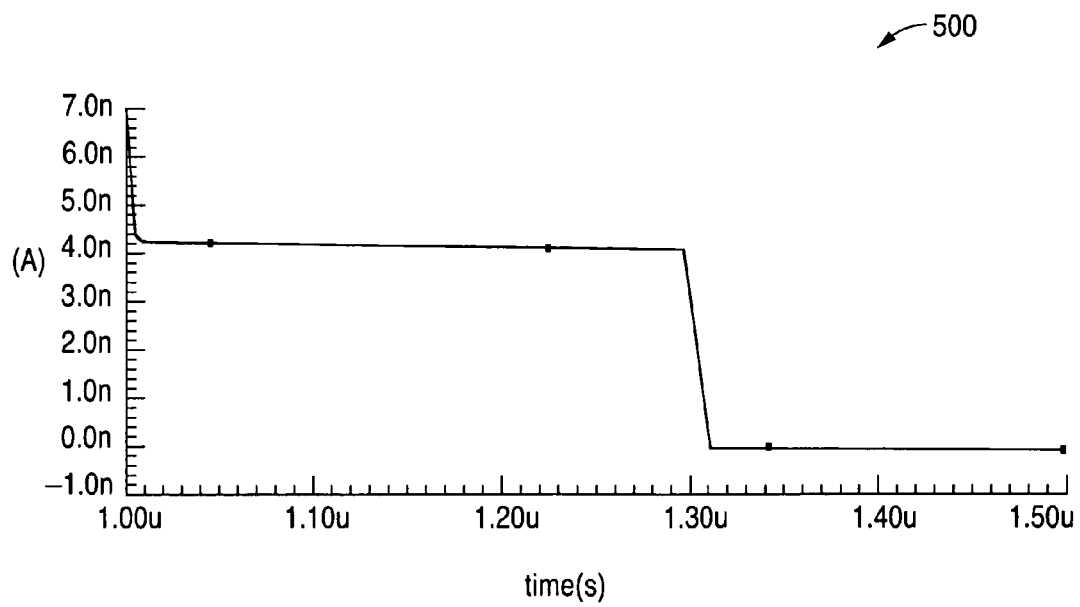
FIG. 5 illustrates a graph versus time of a drain current through n-channel transistor N2 of the floating CMOS input circuit of the present invention during the time that the power supply is being ramped up.

FIG. 5 illustrates a graph versus time of the drain current ID(N2) through first inverter n-channel transistor N2 for the floating CMOS input circuit 400 of the present invention as the power supply VDDH/VDDL is ramped up. The value of the drain current ID(N2) decreases over time and stabilizes at a final value of approximately zero voltages (0.0 V). Due to the fact that both the n-channel pull-down transistor N1 and the p-channel bias transistor P1 are weak, it is relatively easy for a source that is driving the input voltage (Vin) to overcome the effect of the n-channel pull-down transistor N1.

Figure 1:
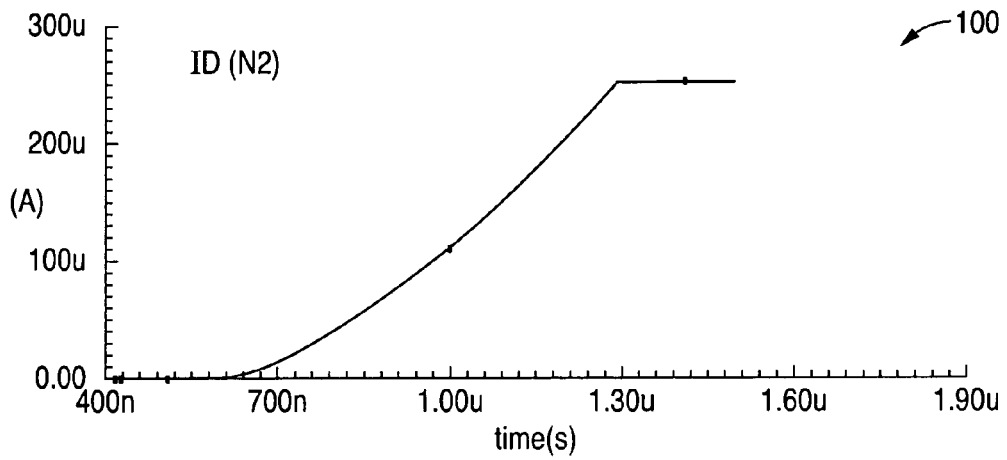
FIG. 1 illustrates an exemplary graph of current versus time of a prior art floating CMOS input circuit in an integrated circuit chip.
Figure 6:
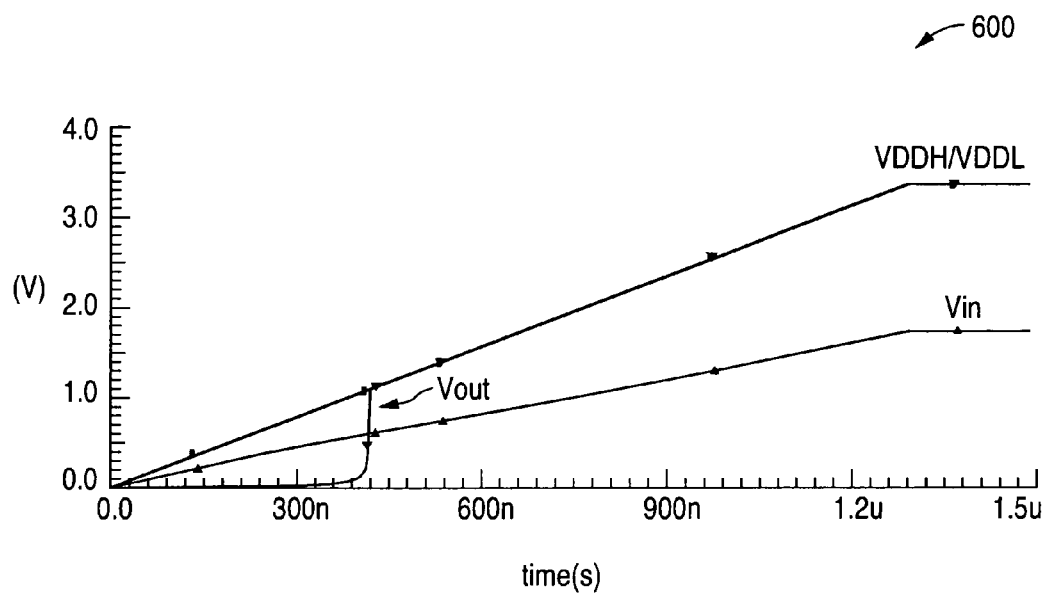
FIG. 6 illustrates a graph versus time showing the response to the prior art floating CMOS input circuit shown in FIG. 2 as the power voltage VDDH/VDDL is ramped up.

FIG. 6 illustrates a graph versus time showing the response of prior art floating CMOS input circuit 200 as the power voltage VDDH/VDDL is ramped up. Typically the value of the input voltage (Vin) floats to some intermediate value of voltage between the ground voltage VSS and the power voltage VDDH/VDDL. This intermediate voltage has a value that is usually near one half of the power voltage VDDH/VDDL. This intermediate value of voltage is what causes the large current ID(N2) that is illustrated in the graph in FIG. 1.

Figure 7:
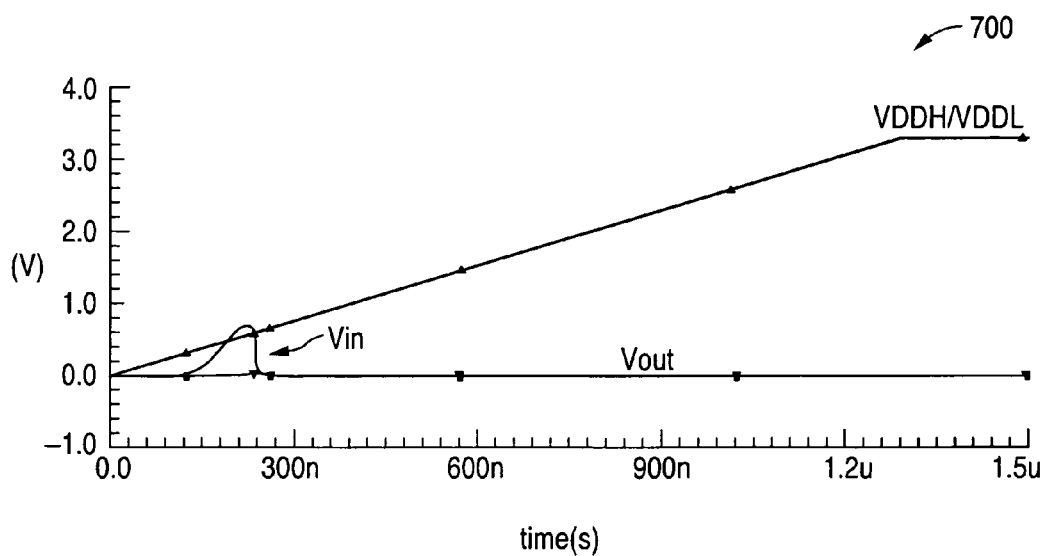
FIG. 7 illustrates a graph versus time showing the response of the floating CMOS input circuit of the present invention shown in FIG. 4 as the power voltage VDDH/VDDL is ramped up.

FIG. 7 illustrates a graph versus time showing the response of the floating CMOS input circuit 400 of the present invention as the power voltage VDDH/VDDL is ramped up. As the power voltage VDDH/VDDL is ramped up, then at some level of the power voltage (typically slightly greater than one (1) Vth) the input voltage (Vin) is driven "low" by the feedback circuit and by n-channel pull-down transistor N1 in particular. Because the input voltage (Vin) is driven to a hard ground, current leakage in the first inverter circuit (first inverter p-channel transistor P2 and first inverter n-channel transistor N2) will not occur.

The floating CMOS input circuit 400 of the present invention also provides an additional benefit in that it powers up in a known state. When the floating CMOS input circuit 400 is powered up it places a "low" signal on the input unless the input is externally driven "high". This means that for "power up" conditions (if the pin is used for configuration) the input circuit of the present invention powers up in a known state.

A prior art floating CMOS input circuit without this feature (or with a pull-down resistor) will sometimes deliver a "high" signal and will sometimes deliver a "low" signal on the input depending up on the last stage that was in the input buffer. For this reason, a prior art floating CMOS input circuit will not power up in a known state.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A floating complementary metal oxide semiconductor (CMOS) input circuit that does not draw direct current, comprising:
   a plurality of inverter circuits coupled in series, a first of the inverter circuits capable of being coupled to an input voltage;
   an n-channel pull-down transistor coupled to the first inverter circuit, the n-channel pull-down transistor capable of pulling the input voltage on the first inverter circuit to a hard ground when the input voltage is one of: floated and driven low; and
   a p-channel bias transistor having a drain coupled to a gate of the n-channel pull-down transistor, a source coupled to a power supply voltage, and a gate coupled to the input voltage.

2. The floating CMOS input circuit as set forth in claim 1 wherein:
   the n-channel pull-down transistor eliminates current leakage on the first inverter circuit.

3. The floating CMOS input circuit as set forth in claim 2 wherein the n-channel pull-down transistor causes the floating CMOS input circuit to power up in a known state.

4. The floating CMOS input circuit as set forth in claim 2 wherein the first inverter circuit comprises a first inverter p-channel transistor and a first inverter n-channel transistor coupled together in an inverter circuit configuration.

5. The floating CMOS input circuit as set forth in claim 4 wherein:
   a gate of the first inverter p-channel transistor and a gate of the first inverter n-channel transistor are coupled to the input voltage;
   a drain of the n-channel pull-down transistor is coupled to the input voltage and to the gate of the first inverter p-channel transistor and to the gate of the first inverter n-channel transistor; and
   a source of the n-channel pull-down transistor is coupled to ground.

6. The floating CMOS input circuit as set forth in claim 5 wherein the first inverter p-channel transistor has a value of drive strength that is at least two times a value of drive strength of the first inverter n-channel transistor.

7. The floating CMOS input circuit as set forth in claim 6 wherein a length of the first inverter p-channel transistor is equal to a length of the first inverter n-channel transistor and a width of the first inverter p-channel transistor is four times a width of the first inverter n-channel transistor.

8. The floating CMOS input circuit as set forth in claim 5 wherein the gate of the n-channel pull-down transistor receives a high signal when the input voltage is not driven high.

9. The floating CMOS input circuit as set forth in claim 8 wherein in response to receiving the high signal the n-channel pull-down transistor pulls the input voltage to the hard ground.

10. The floating CMOS input circuit as set forth in claim 8 wherein the n-channel pull-down transistor does not pull the input voltage to the hard ground when the input voltage is driven high.

11. A floating complementary metal oxide semiconductor (CMOS) input circuit that does not draw direct current, the floating CMOS input circuit comprising:
    a first inverter circuit that is capable of being coupled to an input voltage;
    a second inverter circuit and a third inverter circuit coupled in series with the first inverter circuit;
    an n-channel pull-down transistor coupled to the first inverter circuit that pulls the input voltage on the first inverter circuit to a hard ground when the input voltage is not driven high; and
    a p-channel bias transistor having a drain coupled to an output of the third inverter circuit, a source coupled to a power supply voltage, and a gate coupled to the input voltage.

12. The floating CMOS input circuit as set forth in claim 11 wherein the n-channel pull-down transistor coupled to the first inverter circuit does not pull the input voltage on the first inverter circuit to the hard ground when the input voltage is driven high.

13. The floating CMOS input circuit as set forth in claim 11 wherein:
    the drain of the p-channel bias transistor is coupled to the gate of the n-channel pull-down transistor.

14. The floating CMOS input circuit as set forth in claim 11 wherein the first inverter circuit comprises a first inverter p-channel transistor and a first inverter n-channel transistor coupled together in an inverter circuit configuration; and
    wherein the first inverter p-channel transistor has a value of drive strength that is at least two times a value of drive strength of the first inverter n-channel transistor.

15. The floating CMOS input circuit as set forth in claim 14 wherein a length of the first inverter p-channel transistor is equal to a length of the first inverter n-channel transistor and a width of the first inverter p-channel transistor is at least four time a width of the first inverter n-channel transistor.

16. A floating complementary metal oxide semiconductor (CMOS) input circuit that does not draw direct current, the floating CMOS input circuit comprising:
    a first inverter circuit that is capable of being coupled to an input voltage;
    a second inverter circuit that is coupled to an output of the first inverter circuit;
    a third inverter circuit that is coupled to an output of the second inverter circuit; and
    an n-channel pull-down transistor coupled to the first inverter circuit that pulls the input voltage on the first inverter circuit to a hard ground when the input voltage is not driven high.

17. The floating CMOS input circuit as set forth in claim 16 wherein:
    the first inverter circuit comprises a first inverter p-channel transistor and a first inverter n-channel transistor coupled together in an inverter circuit configuration; and
    the first inverter p-channel transistor has a value of driven strength that is at least two times a value of drive strength of the first inverter n-channel transistor;
    the second inverter circuit comprises a second inverter p-channel transistor and a second inverter n-channel transistor coupled together in an inverter circuit configuration;
    the second inverter n-channel transistor has a value of drive strength that is at least two times a value of drive strength of the second inverter p-channel transistor;

the third inverter circuit comprises a third inverter p-channel transistor and a third inverter n-channel transistor coupled together in an inverter circuit configuration; and the third inverter p-channel transistor has a value of drive strength that is at least four times a value of drive strength of the third inverter n-channel transistor.

18. The floating CMOS input circuit as set forth in claim 17 further comprising a p-channel bias transistor wherein the p-channel bias transistor comprises:

a drain coupled to a gate of the n-channel pull-down transistor and to an output of the third inverter circuit;

a source that is coupled to a power supply voltage; and a gate that is coupled to the input voltage.

19. The floating CMOS input circuit as set forth in claim 18 wherein the p-channel bias transistor has a driven strength that is not greater than one fourth of a drive strength of the third inverter p-channel transistor.

* * * * *

UNITED STATES PATENT AND TRADEMARK OFFICE
CERTIFICATE OF CORRECTION

| | |
|---|---|
| PATENT NO. | : 7,362,126 B1 |
| APPLICATION NO. | : 11/205967 |
| DATED | : April 22, 2008 |
| INVENTOR(S) | : Joseph Douglas Wert |

It is certified that error appears in the above-identified patent and that said Letters Patent is hereby corrected as shown below:

Column 2, line 65, delete "F1" and replace with --P1--;

Column 4, line 54, delete "up on" and replace with --upon--; and

Column 6, claim 15, line 37, delete "time" and replace with --times--.

Signed and Sealed this

Second Day of September, 2008

JON W. DUDAS
*Director of the United States Patent and Trademark Office*